US008427351B2

(12) United States Patent
Chou et al.

(10) Patent No.: US 8,427,351 B2
(45) Date of Patent: Apr. 23, 2013

(54) DIGITAL-TO-ANALOG CONVERSION DEVICE

(75) Inventors: Fang-Ding Chou, Taipei County (TW); Chung-Chih Hung, Tainan County (TW)

(73) Assignee: National Chiao Tung University, Hsinchu (TW)

( * ) Notice: Subject to any disclaimer, the term of this patent is extended or adjusted under 35 U.S.C. 154(b) by 50 days.

(21) Appl. No.: 13/032,925

(22) Filed: Feb. 23, 2011

(65) Prior Publication Data

US 2012/0161997 A1 Jun. 28, 2012

(30) Foreign Application Priority Data

Dec. 24, 2010 (TW) ................................ 99145777 A (51) Int. Cl.
*H03M 1/66* (2006.01)
(52) U.S. Cl.
USPC ........................................................ 341/144
(58) Field of Classification Search .................. 341/144; 327/276, 277, 278
See application file for complete search history.

(56) References Cited

U.S. PATENT DOCUMENTS

| | | | |
|---|---|---|---|
| 4,127,034 A * | 11/1978 | Lederman et al. | 73/626 |
| 5,467,041 A * | 11/1995 | Baba et al. | 327/276 |
| 6,507,295 B2 | 1/2003 | Volk | |
| 6,518,906 B2 | 2/2003 | Abel et al. | |
| 7,587,650 B2 * | 9/2009 | Heath et al. | 714/744 |
| 7,729,593 B2 * | 6/2010 | Yamada | 386/201 |
| 7,965,212 B1 * | 6/2011 | Turner | 341/144 |
| 2007/0090981 A1 | 4/2007 | Chou | |

FOREIGN PATENT DOCUMENTS

CN 1829063 A 9/2006

OTHER PUBLICATIONS

Meng-Hung Shen, Jen-Huan-Tsai, and Po-Chiun Huang; Random Swapping Dynamic Element Matching Technique for Glitch Energy Minimization in Current-Steering DAC; IEEE Transactions on Circuits and Systems-II: Express Briefs, vol. 57, No. 5, May 2010, pp. 369-373.
Jurgen Deveugele and Michiel S.J. Steyaert; A 10-bit 250-MS/s Binary-Weighted Current-Steering DAC; IEEE Journal of Solid-State Circuits, vol. 41, No. 2, Feb. 2006, pp. 320-329.
A. Van Den Bosch, M. Steyaert, W. Sansen; A 800 MHz Ultra Low Glitch Energy 6-Bit CMOS D/A Converter; Solid-State Circuits Conference, proc. ESSCIRC 1998, pp. 172-175, pp. 172-175.

* cited by examiner

*Primary Examiner* — Brian Young
(74) *Attorney, Agent, or Firm* — Rosenberg, Kleni & Lee (57) ABSTRACT

A digital-to-analog conversion device is disclosed. The digital-to-analog conversion device comprises a variable delay buffer circuit and a plurality of synchronization circuits. The buffer circuit receives a digital signal with a plurality of bits and sequentially outputs a plurality of first complementary digital signal sets delayed according to the order of from MSB to LSB. Each synchronization circuit receives the first complementary digital signal set and a clock signal, uses the clock signal as the timing reference of the first complementary digital signal set, and outputs a second complementary digital signal set corresponding to the first complementary digital signal set to a digital-to-analog conversion unit, so as to convert the second complementary digital signal sets into an analog signal. The present invention uses the delays respectively corresponding to different input bits to control the timing of current switches, whereby the transient glitches are reduced.

11 Claims, 6 Drawing Sheets

DIGITAL-TO-ANALOG CONVERSION DEVICE

BACKGROUND OF THE INVENTION

1. Field of the Invention

The present invention relates to a conversion device, particularly to a digital-to-analog conversion device.

2. Description of the Related Art

With great advance of digital technology and extensive application of integrated circuit, digitalization has been a normal measure to process signals, wherein analog signals—the dominant signals in the nature—are sampled to form digital signals. The digital signals are analyzed, compressed and transmitted, whereby the advantages thereof can be fully utilized. Then, the digital signals are decompressed and reduced into the original analog signals in the receiving end. The digital signals will have slight distortion in the transmission process. However, the distortion is within a tolerable range. The advantage of digitalization is much greater than the trivial disadvantage thereof. Therefore, signal digitalization has been widely applied to various fields, such mobile phones, digital cameras, web phones, voice recognition systems, fingerprint recognition systems, sport apparatus controllers, etc. Undoubtedly, a digital world has descended on us. Hence, DAC (digital-to-analog converter) has become a frequently-used component in various digital products.

Figure 1:
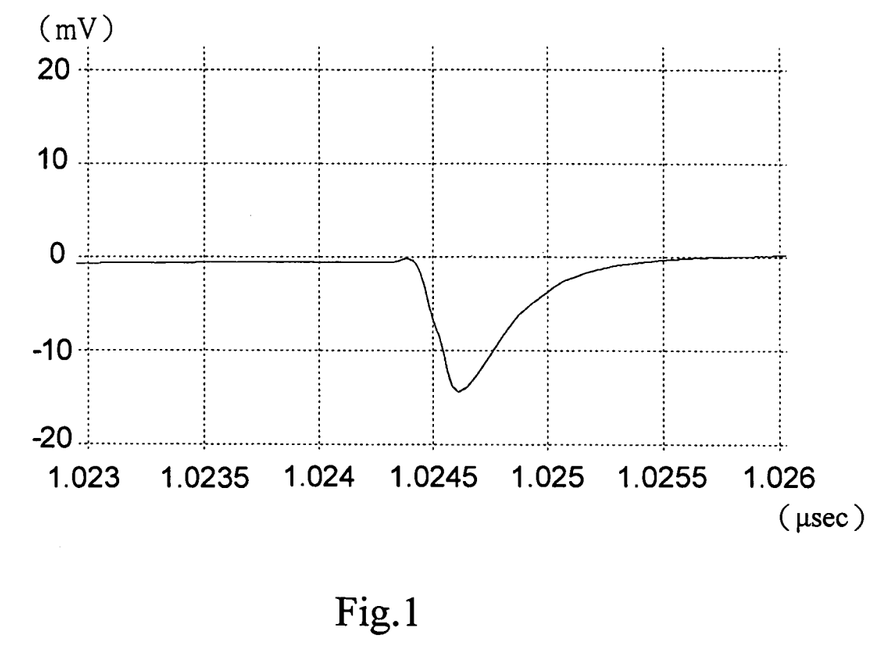
FIG. 1 shows a voltage waveform of an analog output during a major code transition in the conventional technology.

Among high-speed and high-resolution DAC design, the current-steering DAC has the optimized architecture because it can directly drive a resistor of tens of ohms without using any extra amplifier. Among the current-steering DACs, the binary-weighted type has the most direct and simplest implementation. However, the binary-weighted DAC has a very big problem: when digital input varies, the output end would have a transient glitch. Especially in a major code transition from 0111 . . . 11 to 1000 . . . 00, the analog output would have a very big surge, which will damage the monotonicity of DAC, as shown in FIG. 1. The glitch results from the mismatched bits in the path from input to output. A thermometer-code DAC can effectively reduce transient glitch. However, the thermometer-code DAC further needs a binary-to-unary decoder. When applied to the case having a great member of bits, the binary-to-unary decoder has disadvantages of large area, low speed, and high average power consumption. Therefore, the binary-to-unary decoder is unsuitable for high-speed and high-resolution DACs. Thus, many DAC designs adopt a segmented architecture to integrate the advantages of the binary-weighted DAC and the thermometer-code DAC, wherein the case of MSB (Most Significant Bit) adopts the thermometer-code architecture and the case of LSB (Least Significant Bit) adopts the binary-weighted architecture. However, the segmented architecture still has non-monotonicity in the LSB part. Further, the segmented architecture needs additional delay circuits to synchronize MSB signals and LSB signals.

Accordingly, the present invention proposes a digital-to-analog conversion device to overcome the abovementioned problems.

SUMMARY OF THE INVENTION

The primary objective of the present invention is to provide a digital-to-analog conversion device, which adopts a small-area, low-power consumption variable delay buffer circuit to regulate delays of different input bits, control the timings of electronic switches and vary the time of rising or descending of signals of electronic switches, whereby is effectively reduce transient glitch and promoted SFDR (Spurious-Free Dynamic Range).

To achieve the abovementioned objective, the present invention proposes a digital-to-analog conversion device, which comprises a variable delay buffer circuit, a plurality of synchronization circuits, and a digital-to-analog conversion unit. The variable delay buffer circuit receives a digital signal containing a plurality of bits and sequentially outputs first complementary digital signal sets delayed according to the order from MSB to LSB. Each synchronization circuit receives the first complementary digital signal set and a clock signal, uses the clock signal as the timing reference of the first complementary digital signal set, and outputs a second complementary digital signal set corresponding to the first complementary digital signal set to a digital-to-analog conversion unit. The digital-to-analog conversion unit further comprises a plurality of current sources respectively outputting currents sequentially increased in a binary-weighted way according to the order from LSB to MSB; a plurality of electronic switches respectively connected with the synchronization circuits and the current sources and respectively receiving the second complementary digital signal sets to switch conduction states of the electronic switches; and at least one resistor connected with the electronic switches, wherein the conduction states of the electronic switches respectively determine values of currents flowing from the current sources to the resistor so as to generate an analog signal.

Below, the embodiments are described in detail in cooperation with the drawings to make easily understood the characteristics, technical contents and accomplishments of the present invention.

DETAILED DESCRIPTION OF THE INVENTION

Figure 2:
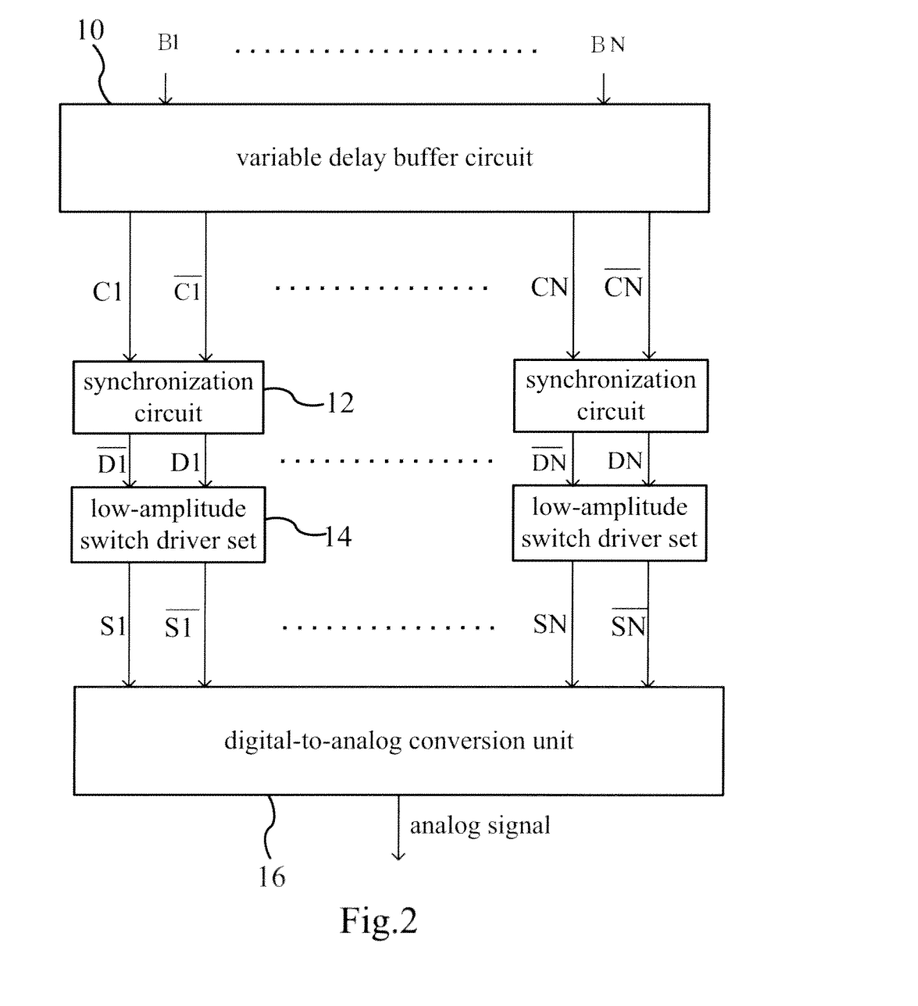
FIG. 2 is a block diagram schematically showing the architecture of a digital-to-analog conversion device according to one embodiment of the present invention.

Refer to FIG. 2. The digital-to-analog conversion device of the present invention comprises a variable delay buffer circuit 10, a plurality of synchronization circuits 12 connecting with the variable delay buffer circuit 10, and a digital-to-analog conversion unit 16. The variable delay buffer circuit 10 receives a digital signal containing a plurality of bits and outputs a plurality of first complementary digital signal sets respectively delayed according to the order from MSB to LSB. Bi denotes a bit, and Ci and $\overline{Ci}$ denote a first complementary digital signal set, wherein i denotes a natural number.

The synchronization circuits 12 are connected with a high voltage VDD, receive the first complementary digital signal sets and a clock signal, use the clock signal as the timing reference of the first complementary digital signal sets, and output second complementary digital signal sets corresponding to the first complementary digital signal sets. Di and $\overline{Di}$ denote a second complementary digital signal set, and i denotes a natural number. Each synchronization circuit 12 is connected with a low-amplitude switch driver set 14, and the low-amplitude switch driver set 14 is connected with a high voltage VDD. The low-amplitude switch driver set 14 receives one second complementary digital set to regulate the amplitude of the second complementary digital set to be smaller than the amplitude of the full swing. The low-amplitude switch driver set 14 outputs the regulated second complementary digital set to the digital-to-analog conversion unit 16. The digital-to-analog conversion unit 16 converts the regulated second complementary digital sets into an analog signal. Si and $\overline{Si}$ denote the regulated second complementary digital set, and i denotes a natural number.

Figure 3:
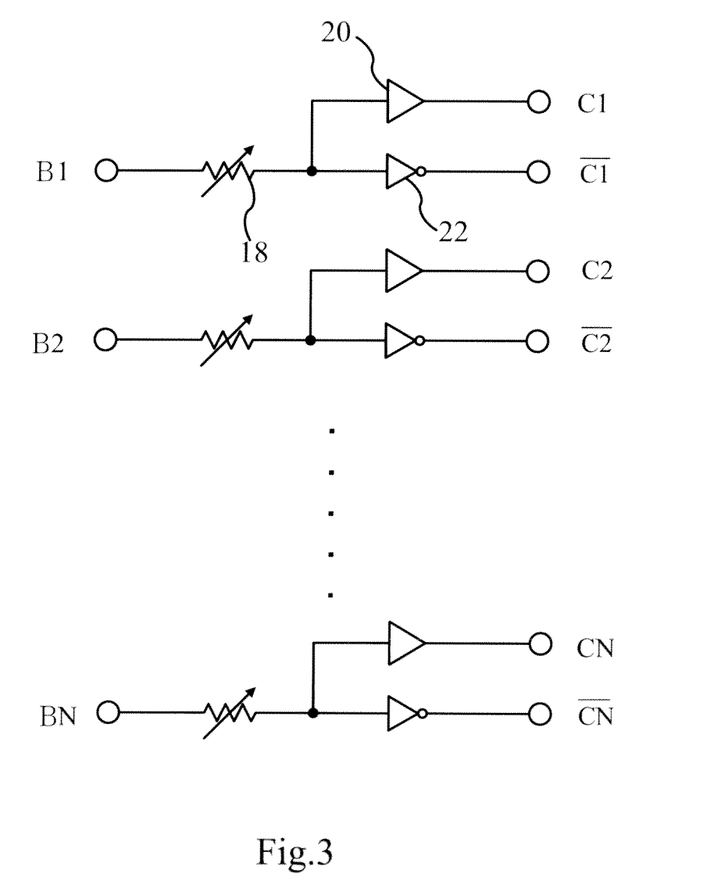
FIG. 3 is a diagram schematically showing a variable delay buffer circuit according to one embodiment of the present invention.

Refer to FIG. 3. The variable delay buffer circuit 10 further comprises variable resistors 18. The resistances of the variable resistors 18 are sequentially decreased in a binary-weighted way according to the order from LSB to MSB, wherein $Ri=R/2^i$, Ri is the resistance of the variable resistor 18, and i is a natural number. Each variable resistor 18 is connected with a buffer 20 and an inverter 22. Each buffer 20 receives bits via the corresponding variable resistor 18 and sequentially outputs digital buffer signals delayed according to the order from MSB to LSB. Each inverter 22 receives bits via the corresponding variable resistor 18 and sequentially outputs digital invert signals delayed according to the order from MSB to LSB. Thereby, a digital buffer signal and a digital invert signal, corresponding to an identical bit, form the first complementary digital signal set, wherein the digital buffer signal and the digital invert signal are respectively denoted by Ci and $\overline{Ci}$, and i is a natural number. An MSB output needs more current switches to drive the digital-to-analog conversion unit 16. Therefore, the present invention regulates the resistance to offset the difference between MSB and LSB. In the present invention, the buffer 20 or the inverter 22 for MSB can be designed to be of the same size as that for LSB or only slightly larger than that for LSB. Therefore, the buffer 20 or the inverter 22 for MSB does not occupy too much space in the present invention. The present invention uses variable resistors 18 to regulate input delays. Thereby, the output end neither needs any additional sample-keeping circuit nor needs the decoder of the thermometer-code DAC. Therefore, the present invention has advantages of small area, low power consumption, high speed and simple circuit.

Figure 4:
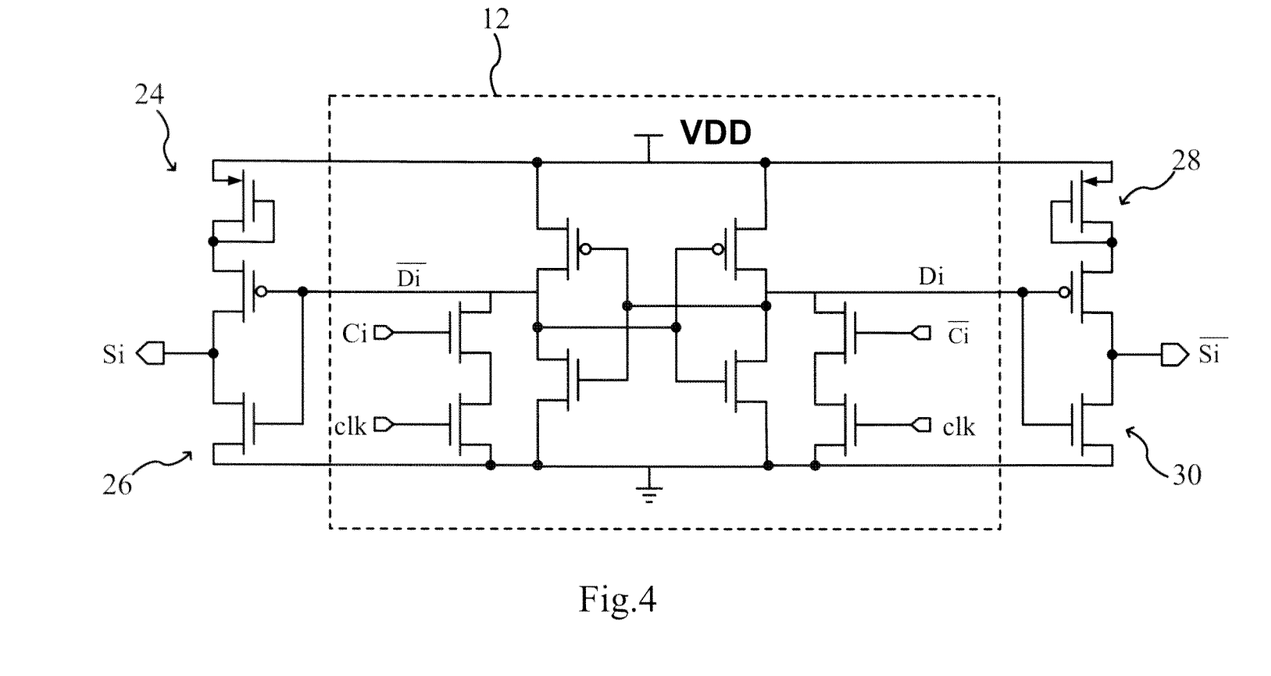
FIG. 4 is a diagram schematically showing a synchronization circuit and a low-amplitude switch driver set according to one embodiment of the present invention.

Refer to FIG. 2 and FIG. 4. In one embodiment, a latch circuit is used to exemplify the synchronization circuit 12. The second complementary digital signal set includes a digital synchronization signal and a digital invert synchronization signal respectively denoted by Di and $\overline{Di}$, wherein i is a natural number. Each low-amplitude switch driver set 14 further comprises a first P-channel FET (Field Effect Transistor) 24 connected with a high voltage VDD and a first inverter 26. The threshold voltage of the first P-channel FET 24 is lower than the threshold voltage of transistors of the first inverter 26. The first inverter 26 receives the digital invert synchronization signal $\overline{Di}$, regulates the amplitude of the digital invert synchronization signal $\overline{Di}$ to be lower than the amplitude of the full swing, inverts the regulated digital invert synchronization signal $\overline{Di}$, and outputs the inverted regulated digital invert synchronization signal $\overline{Di}$ to the digital-to-analog conversion unit 16. Each low-amplitude switch driver set 14 also comprises a second P-channel FET 28 connected with a high voltage VDD and a second inverter 30. The threshold voltage of the second P-channel FET 28 is lower than the threshold voltage of transistors of the second inverter 30. The second P-channel FET 28 receives the digital synchronization signal Di, regulates the amplitude of the digital synchronization signal Di to be lower than the amplitude of the full swing, inverts the regulated digital synchronization signal Di, and outputs the inverted regulated digital synchronization signal Di to the digital-to-analog conversion unit 16. The activities of regulating the digital synchronization signal Di and the digital invert synchronization signal $\overline{Di}$ to reduce the amplitudes thereof not only can increase the overall speed of the system but also can decrease surge in major code transition.

Figure 5:
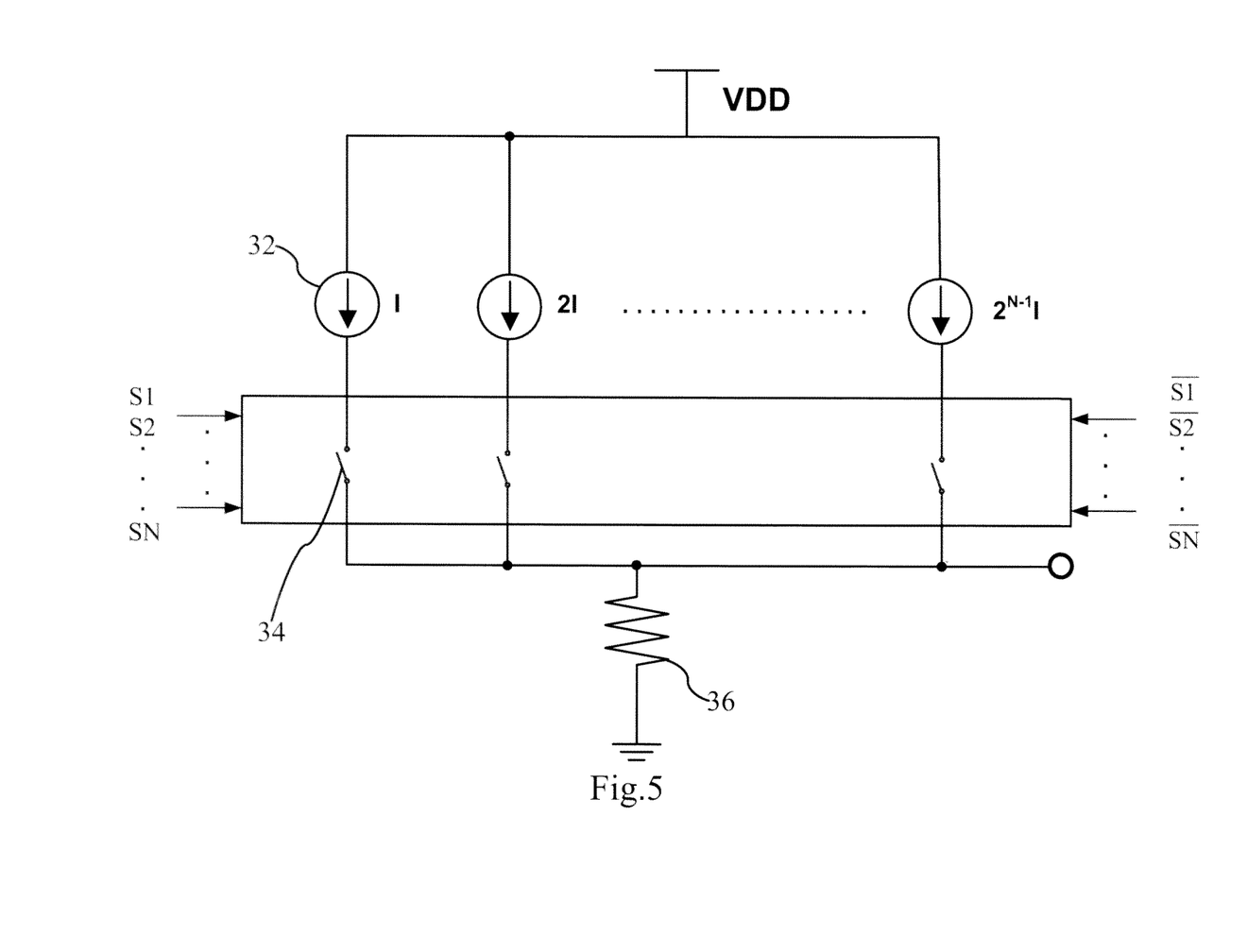
FIG. 5 is a diagram schematically showing a current-steering digital-to-analog conversion unit according to one embodiment of the present invention.

Refer to FIG. 2 and FIG. 5. The digital-to-analog conversion unit 16 may be realized with a resistive digital-to-analog conversion unit, a current-steering digital-to-analog conversion unit, or a capacitive digital-to-analog conversion unit. In this embodiment shown in FIG. 5, the digital-to-analog conversion unit 16 is exemplified by a current-steering digital-to-analog conversion unit. The current-steering digital-to-analog conversion unit includes a plurality of current sources 32, a plurality of electronic switches 34 and at least one resistor 36. The electronic switch 34 may be designed to be a single-end output element or a differential-end output element. If the electronic switch 34 is a single-end output element, only a single resistor 36 is used. If the electronic switch 34 is a differential-end output element, two resistors 36 are used. In this embodiment shown in FIG. 5, a single resistor 36 is used. The currents of the current sources 32 are sequentially increased in a binary-weighted way according to the order from LSB to MSB, wherein $Ii=2^{i-1}I$, Ii is the value of a current source 32, and i is a natural number. Each electronic switch 34 is connected with the corresponding low-amplitude switch driver set 14 and the corresponding current source 32, and receives the second complementary digital set Si and $\overline{Si}$ regulated by the corresponding low-amplitude switch driver set 14 whereby to switch the conduction state thereof. The resistor 36 is connected with the electronic switches 34. The current of the current source 32 flows to the corresponding resistor 35 according to the conduction state of each electronic switch 34, whereby an analog signal is generated. The currents of the current sources 32 are sequentially increased in a binary-weighted way. Therefore, the present invention not only can independently function as a binary-weighted DAC but also can function as the LSB portion of a segmented DAC or DACs for wireless communication devices.

Refer to FIG. 3. Each buffer 20 and the accompanying inverter 22 receive the corresponding bit via the variable resistor 18 and sequentially output the digital buffer signal Ci and the digital invert signal $\overline{Ci}$ delayed according to the order from MSB to LSB. In other words, the lower the bit, the slower the output. As a higher bit needs to trigger more current switches, it is output faster.

Refer to FIG. 4 and FIG. 5. Each synchronization circuit 12 receives a clock signal, a digital buffer signal Ci and a digital invert signal $\overline{Ci}$, uses the clock signal as the timing reference, and outputs the digital synchronization signal Di and the digital invert synchronization signal $\overline{Di}$. The first inverter 26 and the second inverter 30, which are connected with the synchronization circuit 12, respectively receive the digital invert synchronization signal $\overline{Di}$ and the digital synchronization signal Di, regulate the amplitudes of the digital invert synchronization signal $\overline{Di}$ and the digital synchronization signal Di to be smaller than the amplitude of the full swing, invert the regulated the digital invert synchronization signal $\overline{Di}$ and the regulated digital synchronization signal Di, and output the inverted regulated the digital invert synchronization signal $\overline{Di}$ and the inverted regulated digital synchronization signal Di to an identical electronic switch 34 whereby to control the conduction state of the electronic switch 34. The conduction state of each electronic switch 34 controls the value of current flowing from the corresponding current source 32 to the resistor 36 whereby to generate an analog signal.

In the present invention, the digital buffer signals Ci and the digital invert signals $\overline{Ci}$ are delayed to concert the timings of the electronic switches 34 and vary the time of signal rising or signal descending of the electronic switches 34, whereby is obviously reduced the transient glitch and increased SFDR.

Figure 6:
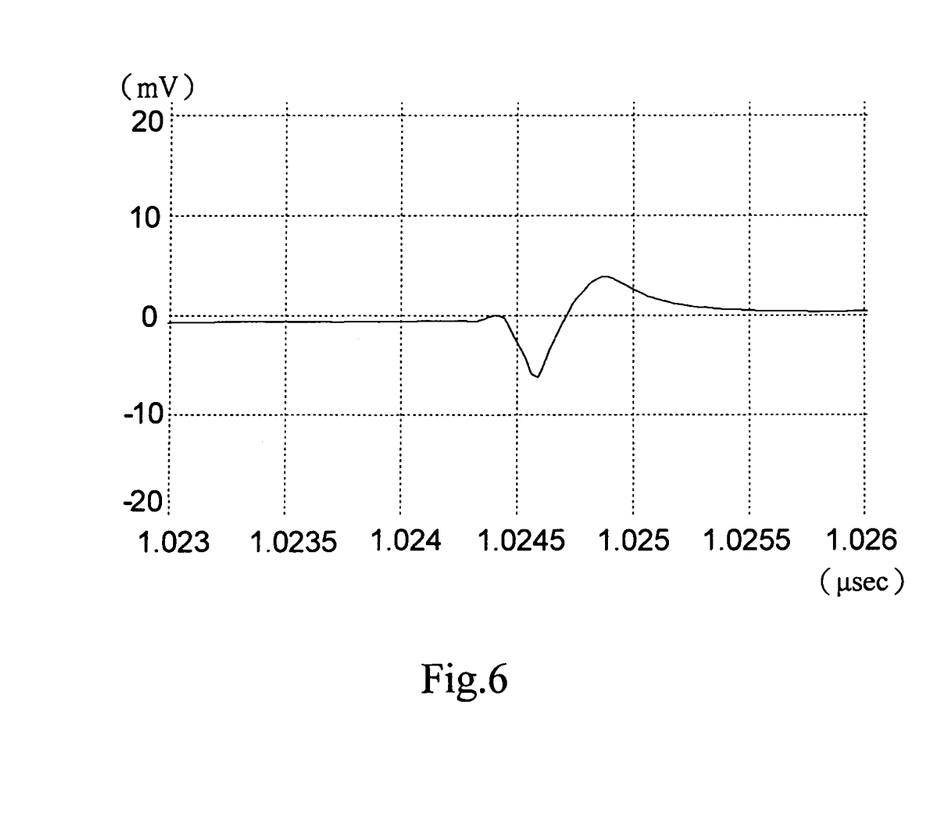
FIG. 6 shows a voltage waveform of an analog output during a major code transition according to one embodiment of the present invention.

Refer to FIG. 6 showing the waveform output during a major code transition. In comparison with the waveform in FIG. 1, the transient glitch in FIG. 6 is reduced, and the positive semi-period and the negative semi-period of the waveform become symmetric, via the compensation of the variable delay buffer circuit 10. The benefit of the symmetric waveform is that the positive and negative semi-periods counterbalance each other in calculating glitch energy. Thus is improved the linearity.

In conclusion, the present invention uses a variable delay buffer circuit to regulate input delays to achieve a digital-to-analog conversion device featuring small area, low complexity, high speed, low power consumption, and reduced transient glitch.

The embodiments described above are only to exemplify the present invention but not to limit the scope of the present invention. Any equivalent modification or variation according to the spirit or characteristic of the present invention is to be also included within the scope of the present invention.

What is claimed is:

1. A digital-to-analog conversion device comprising:
a variable delay buffer circuit receiving a digital signal to be converted containing a plurality of bits ordered from MSB (Most Significant Bit) to LSB (Least Significant Bit), said variable delay buffer circuit outputting for each bit a first complementary digital signal set, said first complementary digital signal sets for the bits being delayed one with respect to the other according to the order thereof between the MSB and LSB;
a plurality of synchronization circuits respectively receiving said first complementary digital signal sets and a clock signal, using said clock signal as a timing reference of said first complementary digital signal sets, and outputting a plurality of variably delayed second complementary digital signal sets corresponding to said first complementary digital signal sets; and
a digital-to-analog conversion unit receiving said second complementary digital signal sets and converting said second complementary digital sets into an analog signal.

2. A digital-to-analog conversion device comprising:
a variable delay buffer circuit receiving a digital signal containing a plurality of bits and outputs a plurality of first complementary digital signal sets respectively delayed according to the order from MSB (Most Significant Bit) to LSB (Least Significant Bit);
a plurality of synchronization circuits respectively receiving said first complementary digital signal sets and a clock signal, using said clock signal as a timing reference of said first complementary digital signal sets, and outputting second complementary digital signal sets corresponding to said first complementary digital signal sets; and
a digital-to-analog conversion unit receiving said second complementary digital signal sets and converting said second complementary digital sets into an analog signal;
wherein digital-to-analog conversion unit is a resistive digital-to-analog conversion unit, a current-steering digital-to-analog conversion unit or a capacitive digital-to-analog conversion unit.

3. The digital-to-analog conversion device according to claim 1, wherein said digital-to-analog conversion unit further comprises:
a plurality of current sources respectively outputting currents sequentially increased in a binary-weighted way according to an order from LSB to MSB;
a plurality of electronic switches respectively connected with said synchronization circuits and said current sources and respectively receiving said second complementary digital signal sets to switch conduction states of said electronic switches; and
at least one resistor connected with said electronic switches, wherein currents of said current sources flow to said resistor according to said conduction states of said electronic switches, which generates an analog signal.

4. A digital-to-analog conversion device comprising:
a variable delay buffer circuit receiving a digital signal containing a plurality of bits and outputs a plurality of first complementary digital signal sets respectively delayed according to the order from MSB (Most Significant Bit) to LSB (Least Significant Bit);
a plurality of synchronization circuits respectively receiving said first complementary digital signal sets and a clock signal, using said clock signal as a timing reference of said first complementary digital signal sets, and outputting second complementary digital signal sets corresponding to said first complementary digital signal sets; and
a digital-to-analog conversion unit receiving said second complementary digital signal sets and converting said second complementary digital sets into an analog signal;
wherein each said synchronization circuit is connected with a low-amplitude switch driver set that is connected with a high voltage, receives one said second complementary digital set, regulates an amplitude of said second complementary digital set to be smaller than an amplitude of a full swing and then outputs said second complementary digital set to said digital-to-analog conversion unit.

5. The digital-to-analog conversion device according to claim 4, wherein each said second complementary digital signal set includes a digital synchronization signal and a digital invert synchronization signal, and wherein each said low-amplitude switch driver set further comprises:
a first P-channel FET (Field Effect Transistor) connected with said high voltage;
a first inverter connected with said first P-channel FET, having a threshold voltage greater than a threshold of said first P-channel FET, receiving said digital invert synchronization signal, regulating an amplitude of said digital invert synchronization signal to be smaller than an amplitude of a full swing, inverting and outputting said digital invert synchronization signal to said digital-to-analog conversion unit;
a second P-channel FET connected with said high voltage; and
a second inverter connected with said second P-channel FET, having a threshold voltage greater than a threshold of said second P-channel FET, receiving said digital synchronization signal, regulating an amplitude of said digital synchronization signal to be smaller than an amplitude of a full swing, inverting and outputting said digital synchronization signal to said digital-to-analog conversion unit.

6. The digital-to-analog conversion device according to claim 1, wherein each said synchronization circuit is a latch circuit.

7. The digital-to-analog conversion device according to claim 1, wherein said variable delay buffer circuit further comprises:
 a plurality of variable resistors having resistances sequentially decreased according to an order from LSB to MSB;
 a plurality of buffers respectively connected with said variable resistors, receiving said bits via said variable resistors corresponding to said buffers, and sequentially outputting digital buffer signals delayed according to an order from MSB to LSB; and
 a plurality of inverters respectively connected with said variable resistors, receiving said bits via said variable resistors corresponding to said inverters, and sequentially outputting digital invert signals delayed according to an order from MSB to LSB, wherein said digital invert signal and said digital buffer signal both corresponding to an identical said bit form said first complementary digital signal set.

8. The digital-to-analog conversion device according to claim 7, wherein resistances of said variable resistors are sequentially decreased in a binary-weighted way according to an order from LSB to MSB.

9. The digital-to-analog conversion device according to claim 1, wherein digital-to-analog conversion unit is a resistive digital-to-analog conversion unit, a current-steering digital-to-analog conversion unit or a capacitive digital-to-analog conversion unit.

10. The digital-to-analog conversion device according to claim 1, wherein each said synchronization circuit is connected with a low-amplitude switch driver set that is connected with a high voltage, receives one said second complementary digital set, regulates an amplitude of said second complementary digital set to be smaller than an amplitude of a full swing and then outputs said second complementary digital set to said digital-to-analog conversion unit.

11. The digital-to-analog conversion device according to claim 10, wherein each said second complementary digital signal set includes a digital synchronization signal and a digital invert synchronization signal, and wherein each said low-amplitude switch driver set further comprises:
 a first P-channel FET (Field Effect Transistor) connected with said high voltage;
 a first inverter connected with said first P-channel FET, having a threshold voltage greater than a threshold of said first P-channel FET, receiving said digital invert synchronization signal, regulating an amplitude of said digital invert synchronization signal to be smaller than an amplitude of a full swing, inverting and outputting said digital invert synchronization signal to said digital-to-analog conversion unit;
 a second P-channel FET connected with said high voltage; and
 a second inverter connected with said second P-channel FET, having a threshold voltage greater than a threshold of said second P-channel FET, receiving said digital synchronization signal, regulating an amplitude of said digital synchronization signal to be smaller than an amplitude of a full swing, inverting and outputting said digital synchronization signal to said digital-to-analog conversion unit.

* * * * *